US009408322B2

(12) United States Patent
Kuwabara

(10) Patent No.: US 9,408,322 B2
(45) Date of Patent: Aug. 2, 2016

(54) CASE UNIT

(71) Applicant: FUJI ELECTRIC CO., LTD., Kanagawa (JP)

(72) Inventor: Takashi Kuwabara, Kanagawa (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 14/650,881

(22) PCT Filed: May 12, 2014

(86) PCT No.: PCT/JP2014/062646
§ 371 (c)(1),
(2) Date: Jun. 10, 2015

(87) PCT Pub. No.: WO2014/192524
PCT Pub. Date: Dec. 4, 2014

(65) Prior Publication Data
US 2015/0334865 A1    Nov. 19, 2015

(30) Foreign Application Priority Data

May 30, 2013   (JP) .................................. 2013-114720

(51) Int. Cl.
*H05K 7/00* (2006.01)
*H05K 7/14* (2006.01)
(Continued)

(52) U.S. Cl.
CPC ............. *H05K 7/1414* (2013.01); *H01H 9/226* (2013.01); *H05K 5/0008* (2013.01); *H05K 5/0217* (2013.01); *H05K 5/0247* (2013.01)

(58) Field of Classification Search
CPC ........... H01H 9/20; H01H 9/22; H01H 9/223; H01H 9/226; H05K 7/1414
See application file for complete search history.

(56) References Cited

U.S. PATENT DOCUMENTS 3,578,368 A  *  5/1971  Dupuis .................. B41J 29/387
                                                         292/216
5,343,009 A     8/1994  Araoka et al.
                        (Continued)

FOREIGN PATENT DOCUMENTS

JP        2-97810        8/1990
JP        5-204506       8/1993
                        (Continued)

OTHER PUBLICATIONS

International Search Report issued Aug. 5, 2014 in International (PCT) Application No. PCT/JP2014/062646.
(Continued)

*Primary Examiner* — Adrian S Wilson
(74) *Attorney, Agent, or Firm* — Wenderoth, Lind & Ponack, L.L.P.

(57) ABSTRACT

A sliding member that is provided in a front panel of a case so as to be movable in the vertical direction and is placed at a down position due to the own weight is provided with a window portion which covers and hides a screw insertion hole for fixing a unit when the sliding member is located at the down position and exposes the screw insertion hole when the sliding member is lifted to an up position. Further, the front panel is provided with an interlocking switch that controls the operation of the case unit in a manner such that the interlocking switch is turned on while being pressed by the sliding member lifted to the up position and is turned off while the pressing operation is released when the sliding member is located at the down position.

9 Claims, 4 Drawing Sheets

(51) Int. Cl.
*H05K 5/02* (2006.01)
*H05K 5/00* (2006.01)
*H01H 9/22* (2006.01)

(56) References Cited

U.S. PATENT DOCUMENTS

2002/0056619 A1* 5/2002 Dahl .................. H01H 9/20
                                                     200/50.21
2002/0112944 A1* 8/2002 Bernier ................ H01H 9/223
                                                     200/50.15

FOREIGN PATENT DOCUMENTS

JP    2012-109524    6/2012
JP    2012-115025    6/2012

OTHER PUBLICATIONS

Machine translation of JP 2012-109524, Jun. 2012.
Machine translation of JP 05-204506, Aug. 1993.
Machine translation of JP 2012-115025, Jun. 2012.

* cited by examiner

CASE UNIT

TECHNICAL FIELD

The present invention relates to a case unit which is used by being detachably mounted on a rack body, and particularly relates to, a case unit which is provided with an interlocking mechanism suitable for constructing, for example, a large-capacity uninterruptible power supply (UPS) apparatus.

BACKGROUND ART

For example, as illustrated in FIG. 3, a medium/large-capacity uninterruptible power supply (called UPS) apparatus 1 has a configuration in which a plurality of power supply units 3 (3a to 3n) is stacked vertically and detachably mounted on a rack body 2 of a so-called 19 inch size in conformity with the EIA standard. Specifically, for example, the UPS apparatus 1 of 100 kVA is built with five power supply units 3 (3a to 3n) of 20 kVA being mounted on the rack body 2. Furthermore, Reference Numeral 4 of the drawing indicates a control unit which controls the operation of the power supply units 3 (3a to 3n). Reference Numeral 5 indicates an input/output unit which is connected to a power supply line drawn from a system power supply (not illustrated) and a power supply line connected to load equipment (not illustrated).

In addition, the case unit comprising the power supply units 3 (3a to 3n) and the control unit 4 respectively has a configuration that an electric apparatus body such as an electric power converter or a control device is accommodated in a box-shaped case 11 of a 4 U size having a height of 7 inch (approximately 179 mm). The 4 U size indicates the size of the case unit four times the size of a basic unit having a height of 1.75 inch (approximately 44.45 mm). These case units are mounted on or detached from the rack body 2 through the front side of the rack body 2 as illustrated in FIG. 3.

Here, the power supply units 3 (3a to 3n) illustrated in FIG. 3 have, for example, a configuration that a plurality of cooling fans 12 is provided in the front surface of the case 11 so as to forcedly cool a power semiconductor device, etc. in the electric power converter accommodated in the case 11. Further, in each rear surface of the power supply units 3 (3a to 3n), plug-in connectors 13 are provided at both sides of the rear surface of the case 11, for example, as illustrated in FIG. 4.

Those plug-in connectors 13 are connected to connectors (not illustrated) provided in the inner area of the rack body 2 when the power supply units 3 (3a to 3n) are mounted on the rack body 2, and are disconnected from the connectors when the power supply units are detached from the rack body 2. By adopting such a connector structure, the electric connection of the power supply units 3 (3a to 3n) to the rack body 2, and further, the electric connection among the units 3 (3a to 3n), the control unit 4 and the input/output unit 5 is automatically performed only by mounting the power supply units 3 (3a to 3n) on the rack body 2. Here, the electric connection indicates the connection of the power supply lines and the connection of various control signal lines.

Incidentally, when maintenance or the like is performed by separating the power supply units 3 (3a to 3n) from the rack body 2, there is a need to stop the operation of the power supply unit 3a (3b to 3n) by separating the power supply units 3a (3b to 3n) from the rack body so as to interrupt the supply of electric power to the power supply unit. If the power supply unit 3a (or 3b to 3n) is separated from the rack body 2 in the operation state, a problem arises in that a high-voltage spark discharge occurs between the plug-in connector 13 and the connector portion due to so-called hot swapping. As a result, in many cases, such power supply units 3 (3a to 3n) are equipped with an interlocking mechanism which allows the operation of the power supply units 3 (3a to 3n) only when the power supply units are mounted on the rack body 2.

Hitherto, such an interlocking mechanism has been represented as, for example, a switching gear with a shutoff switch, and the interlocking mechanism is configured such that the interlocking state is released only by intentionally sliding a sliding plate biased by a spring. Such an interlocking mechanism is specifically disclosed in, for example, Patent Document 1. Further, for example, Patent Document 2 discloses a device in which a case unit is mounted on rack body. Here, a front surface of the case unit is provided with a sliding plate which covers a fixed screw fixing the case unit to the rack body, and hence the unintentional separation of the fixed screw is prevented.

Specifically, in the interlocking mechanism illustrated in Patent Document 2, an operation lever of a power switch provided in the front surface of the case unit is turned on only when the sliding plate is moved to a position where the fixed screw is covered. Then, the sliding of the sliding plate is allowed only when the operation lever is set to an off position, and the fixed screw is exposed so that the fixed screw may be separated. Then, the case unit may be mounted on or separated from the rack body only when the power switch of the case unit is turned off.

RELATED LITERATURES

Patent Documents

Patent Document 1: Japanese Unexamined Patent Publication No. 2012-115025
Patent Document 2: Japanese Unexamined Patent Publication No. 2012-109524

SUMMARY OF THE INVENTION

Problem to be Solved by the Invention

However, in the interlocking mechanism disclosed in Patent Document 1, there is a need to bias the sliding plate by using a spring. Thus, the structure becomes complex without any doubt. Further, in the interlocking mechanism disclosed in Patent Document 2, it is premised on that the operation lever of the power switch is exposed to the front surface of the case unit. As a result, it is difficult to apply such an interlocking mechanism to the case unit that does not include the power switch on the front surface of the case unit.

The invention is made in consideration of such circumstances, and an object thereof is to provide a case unit with an interlocking mechanism having a simple and easy configuration and being capable of reliably preventing the unintentional separation thereof from a rack body in a hot swapping state even in a case unit of which a front surface is not provided with a power switch.

Means for Solving Problem

A case unit according to the invention accommodates an electric apparatus body, for example, an electric power converter into a case of a predetermined size, is detachably mounted on a rack body from a front surface of the rack body so as to operate the electric power converter as the electric apparatus body, and is suitably used as a power supply unit making, for example, a large-capacity UPS apparatus. Here, the case unit includes a pair of case attachment members that is provided at both ends of a front surface of the case while being projected in the horizontal (width) direction so as to fix the case to the rack body and a screw insertion hole that is provided at each of the case attachment members and is used to insert a fixing screw of the case into the rack body.

Then, in order to achieve the above-described object, the case unit according to the invention includes a sliding member that is provided in a front panel of the case so as to be movable in the vertical direction and is placed at a down position due to the own weight; a window portion that is provided in the sliding member and is used to cover and hide the screw insertion hole when the sliding member is located at the down position and to expose the screw insertion hole when the sliding member is lifted to an the up position against the gravity; and an interlocking switch such as a micro switch that is provided in the case and is used to control the operation of the electric apparatus body in a manner such that the interlocking switch is pressed by the sliding member and turned on when the sliding member is lifted to the up position and is released from the pressing operation of the sliding member and turned off when the sliding member is placed at the down position.

Desirably, the sliding member includes a main body portion that extends in the vertical direction along the front panel of the case, an elongated hole that is formed in the main body portion by boring and is used to movably support the sliding member in the vertical direction while a support member projected in the front panel is inserted therethrough, and an operation member that extends from the main body portion in a direction from the front surface of the front panel toward the rear surface thereof, is projected toward the rear surface of the front panel through a slit hole extending in the vertical direction while being bored in the front panel, and presses against the interlocking switch provided at the rear surface of the front panel of the case.

Desirably, the operation member is formed as, for example, a bent piece that is formed by bending one side edge portion of the main body portion toward the front panel and is inserted through the slit hole.

Further, the case unit has, for example, a configuration in which a rear surface of the case is provided with a plug-in connector which is connected to a connector portion provided in an inner portion of the rack body in accordance with the attachment to the rack body and is separated from the connector portion in accordance with the separation from the rack body. Furthermore, the rack body is used to accommodate a plurality of case units in the vertical direction in a stacked state and to operate the plurality of case units mounted on the rack body in parallel.

Further, the support member projected in the front panel is formed as, for example, a shoulder screw that includes a stepped portion having a length corresponding to the thickness of the sliding member between a screw portion and a head portion and supports the sliding member so as to be movable in the vertical direction by nipping the main body portion of the sliding member between the head portion and the front panel into which the screw portion is threaded.

According to the case unit having the above-described configuration, the case unit is mounted on the rack body, and the fixing screw of the case is threaded into the rack body through the screw insertion hole exposed by lifting the sliding member, so that the case unit is completely mounted on the rack body. In this way, the sliding member is held at the up position by the locking of the sliding member to the head portion of the fixing screw. As a result, the interlocking switch is pressed and biased by the sliding member, and hence electric power may be supplied to the electric apparatus body accommodated in the case unit.

Meanwhile, when the fixing screw of the case is separated, the locking of the sliding member using the fixing screw is released, and then the sliding member displaces to the down position due to the own weight. Accordingly, an operation in which the interlocking switch is pressed and biased by the sliding member is released. As a result, when the fixing screw is separated so that the case unit is extracted from the rack body, the supply of electric power to the electric apparatus body accommodated in the case unit is stopped by the operation in which the interlocking switch is turned off, and hence the operation of the electric apparatus body is stopped. Accordingly, it is possible to prevent a problem in which the case unit is extracted from the rack body in a hot swapping state.

In particular, the above-described case unit has a configuration in which the sliding member falls due to the own weight even by the separation of the fixing screw and displaces to the down position so as to turn off the interlocking switch. Thus, it is possible to reliably stop the operation of the case unit when the case unit is mounted on or separated from the rack body with a simple and easy configuration. Accordingly, it is possible to reliably exhibit the interlocking function for the case unit with a simple and easy configuration, and hence to prevent the hot swapping of the case unit in advance.

DESCRIPTION OF PREFERRED EMBODIMENTS

Figure 3:
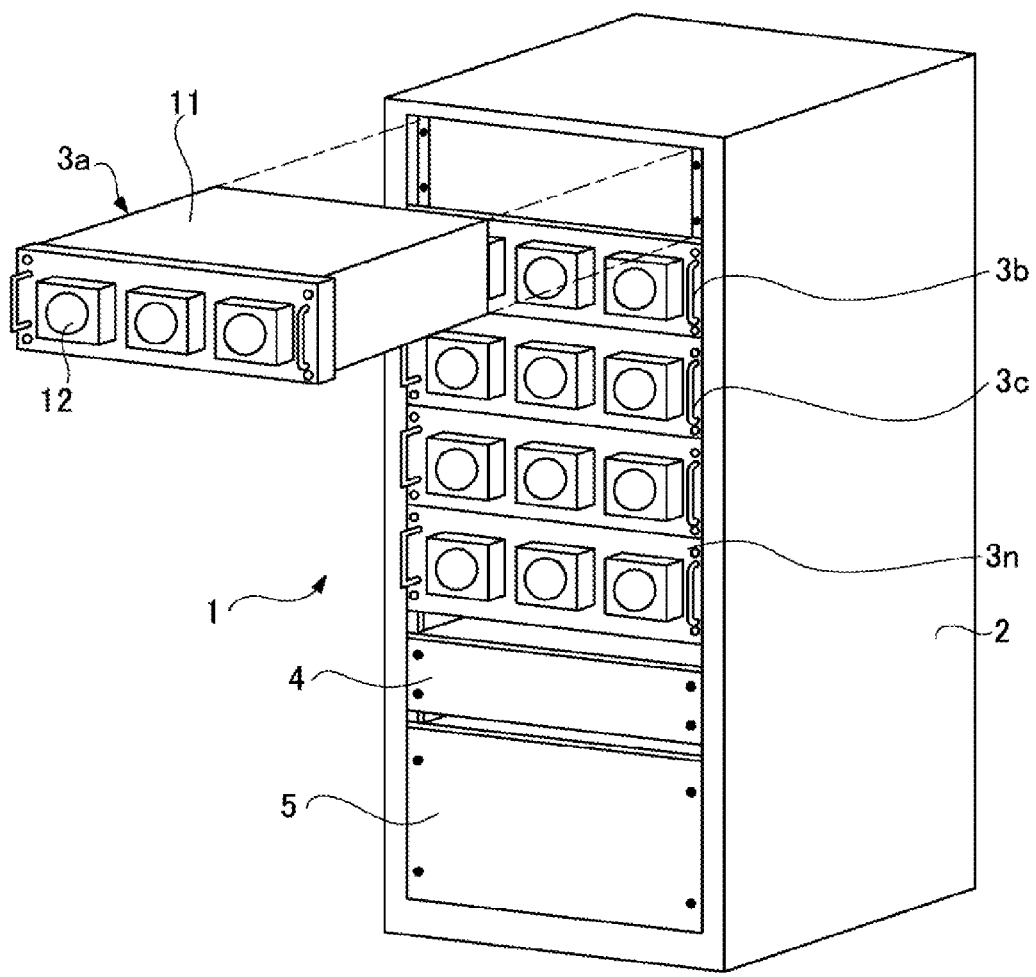
FIG. 3 is a diagram illustrating a schematic configuration of a power supply apparatus obtained by mounting a plurality of case units on a rack body.

Hereinafter, referring to the drawings, a case unit according to an embodiment of the invention will be described by exemplifying a case in which the case unit is applied to each of power supply units 3 (3a to 3n) making a UPS apparatus 1 illustrated in FIG. 3.

Figure 4:
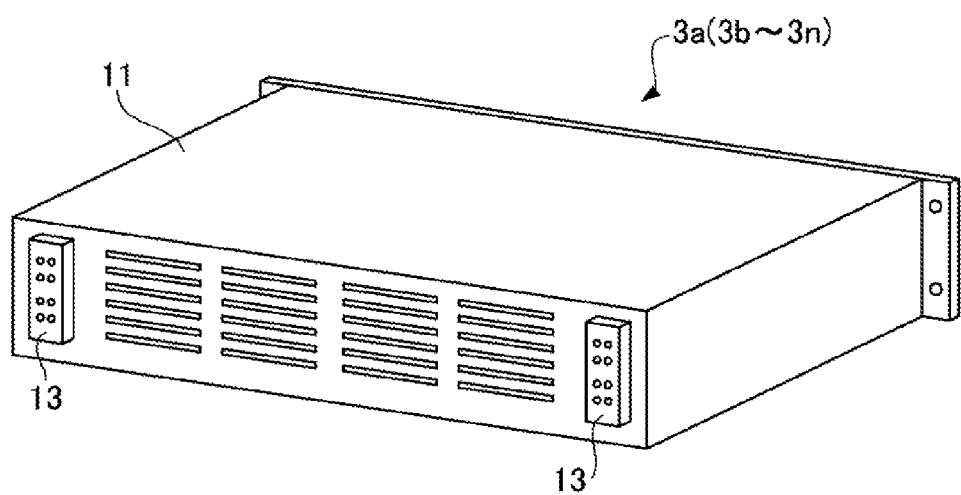
FIG. 4 is a diagram illustrating a configuration of a rear surface of the case unit.

A case unit 10 according to the embodiment, that is, each of the power supply units 3 (3a to 3n) is used to make the UPS apparatus 1 by being detachably mounted on, for example, a 19 inch rack body 2 as described above. Each of the power supply units 3 (3a to 3n) accommodates an electric apparatus body such as an electric power converter into a box-shaped case 11 of a predetermined size. Further, the rear surface of each of the power supply units 3 (3a to 3n), that is, the rear surface of the case 11 is provided with a plug-in connector 13 as illustrated in FIG. 4. Then, the plug-in connector 13 is connected to a connector portion provided in the rear surface of the rack body 2 in accordance with the attachment of each of the power supply units 3 (3a to 3n) at the front surface of the rack body 2. Further, when the power supply units 3 (3a to 3n) are extracted from the rack body 2, the connection of the connector is released.

Figure 1:
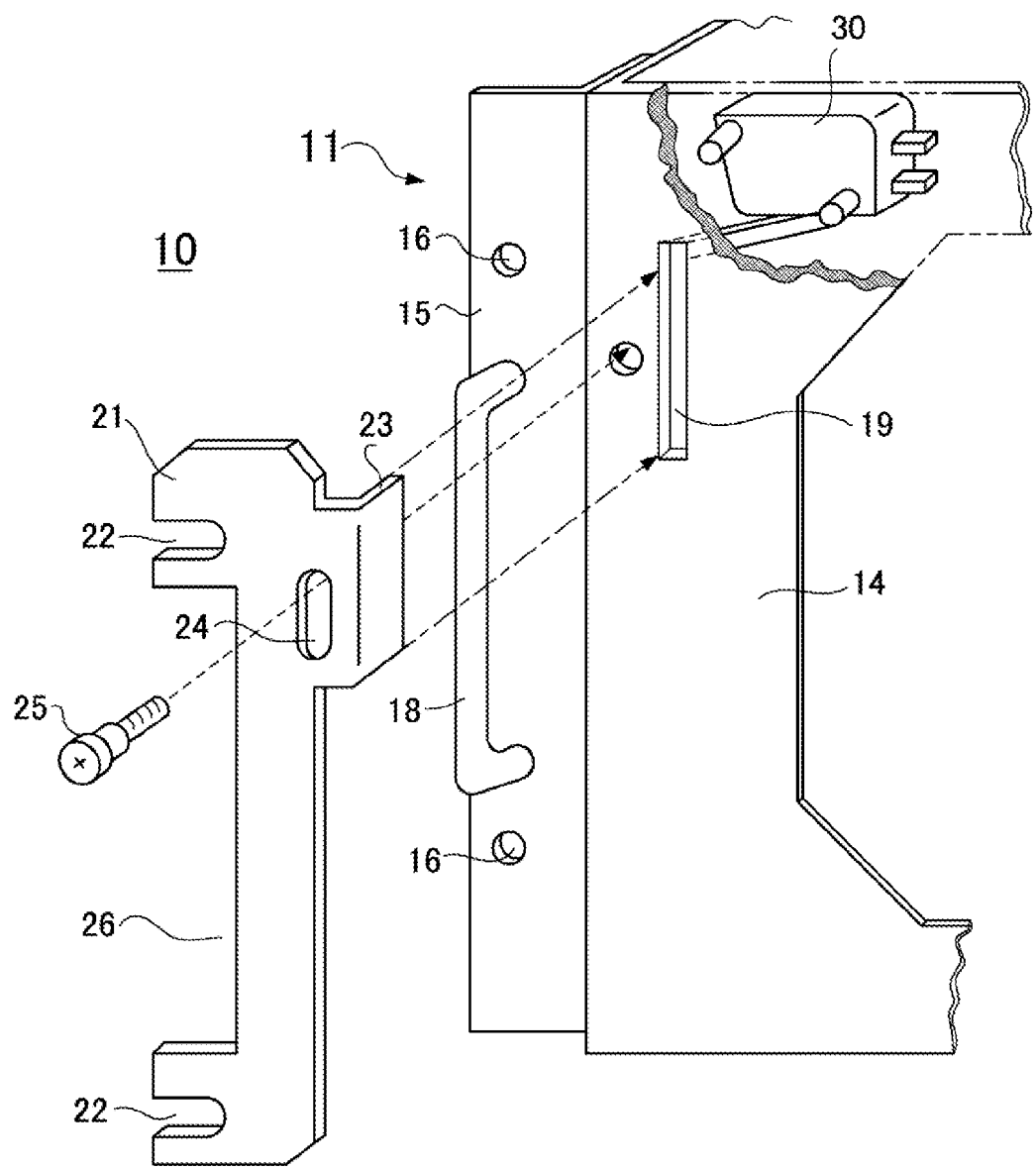
FIG. 1 is an exploded perspective view illustrating a schematic configuration of a main part of a case unit according to an embodiment of the invention.

Incidentally, the case unit 10 according to the invention making each of the power supply units 3 (3a to 3n) is characterized in that an interlocking mechanism mainly including a sliding member 21 is provided in a front end of the case 11 as illustrated in an exploded perspective view illustrating a schematic configuration of a main part in FIG. 1. Further, the front surface of the case 11 is formed by the front panel 14 of the case 11 and case attachment members 15, which are fixed to both side portions of the case 11 and are projected in the horizontal direction from both ends of the front panel 14 respectively.

In addition, the case attachment member 15 is formed as, for example, an L-shaped angle member fixed to each of both side surfaces of the case 11. The case attachment member 15 is provided with, for example, two screw insertion holes 16. Although particularly not illustrated in the drawings, the screw insertion holes 16 correspond to a plurality of screw holes provided at a predetermined arrangement pitch in the vertical direction along the support column of the rack body 2 in order to fix the case unit. As for the operation of fixing the case unit 10 to the rack body 2, first, a fixing screw 17 is inserted through the screw insertion hole 16 from the front surface of the case attachment member 15 and is threaded into a screw hole of the rack body 2 as will be described later. Accordingly, the case attachment member 15 is nipped between the head portion of the fixing screw 17 and the support column of the rack body 2. Further, the case attachment member 15 is provided with a gripping member 18 for the case unit 10 in the front surface of the case attachment member 15 in a projected manner.

Here, the interlocking mechanism which is provided at the front end of the case 11 mainly includes a sliding member 21 that is located at the front surface of the front panel 14 of the case 11, is movable in the vertical direction along the front panel 14, and is placed at the down position due to the own weight. For example, as illustrated in FIG. 1, the sliding member 21 is formed as a plate member with a window portion 22 that covers and hides the screw insertion hole 16 when the sliding member 21 is located at the down position and exposes the screw insertion hole 16 when the sliding member 21 is lifted to the up position against the gravity.

Further, the interlocking mechanism includes an interlocking switch 30 which is provided at the rear surface of the front panel 14 in the case 11 and controls the supply of electric power to the electric apparatus body. The interlocking switch 30 is turned on while being pressed by the sliding member 21 when the sliding member 21 is lifted to the up position and is turned off while the pressing operation using the sliding member 21 is released when the sliding member 21 is placed at the down position. In addition, the interlocking switch 30 is formed as, for example, a micro switch which interrupts the supply of electric power to the electronic device.

Specifically, the sliding member 21 mainly includes a plate member which extends in the vertical direction along the front panel 14 of the case 11. Then, the sliding member has a shape in which one side edge portion of the main body portion, that is, the left side edge portion of the drawing is provided with a U-shaped notch so as to form the window portion 22 and the other side edge portion of the main body portion, that is, the right side edge portion of the drawing is provided with a bent piece 23 which is bent toward the front panel 14 substantially at a right angle. The bent piece 23 is used as an operation member for the interlocking switch 30.

Further, the main body portion is provided with an elongated hole 24 which is formed by boring so as to extend in the vertical direction along the bent piece 23. The elongated hole 24 is used to support the sliding member 21 in the vertical direction between the front panel 14 and a head portion of a shoulder screw 25 while a support member projected to the front panel 14, that is, the shoulder screw 25 threaded into and projected to the front panel 14 is inserted through the elongated hole. Further, the shoulder screw 25 includes a stepped portion having a length corresponding to the thickness of the sliding member 21 between the screw portion and the head portion. The sliding member 21 is provided so as to be movable in the vertical direction along the front panel 14 while being supported by the stepped portion of the shoulder screw 25 fitted into the elongated hole 24.

Meanwhile, the front panel 14 is provided with an elongated slit hole 19 through which the bent piece 23 of the sliding member 21 attached to the front panel 14 is inserted. The slit hole 19 has a length that allows the movement of the bent piece 23 in accordance with the vertical movement of the sliding member 21. The sliding member 21 is attached to the front surface of the front panel 14 while the bent piece 23 is inserted through the slit hole 19. Accordingly, the bent piece 23 is positioned at the rear surface of the front panel 14, and presses against the interlocking switch 30 with the vertical movement of the sliding member 21.

Further, a notched portion 26 which is formed by largely cutting one side edge portion of the main body portion of the sliding member 21 causes two window portions 22 provided at one side edge portion of the main body portion with a predetermined distance therebetween in the vertical direction to be positioned at the upper and lower sides of the gripping member 18. Further, the notched portion 26 is a so-called escape portion that allows the movement of the sliding member 21 while avoiding the gripping member 18. Due to the existence of the notched portion 26, the sliding member 21 is provided so as to be movable in the vertical direction without the interference of the gripping member 18. Then, the window portion 22 displaces to the down position where the screw insertion hole 16 is covered and hidden and the up position where the screw insertion hole 16 is exposed with the movement displacement of the sliding member 21.

Figure 2:
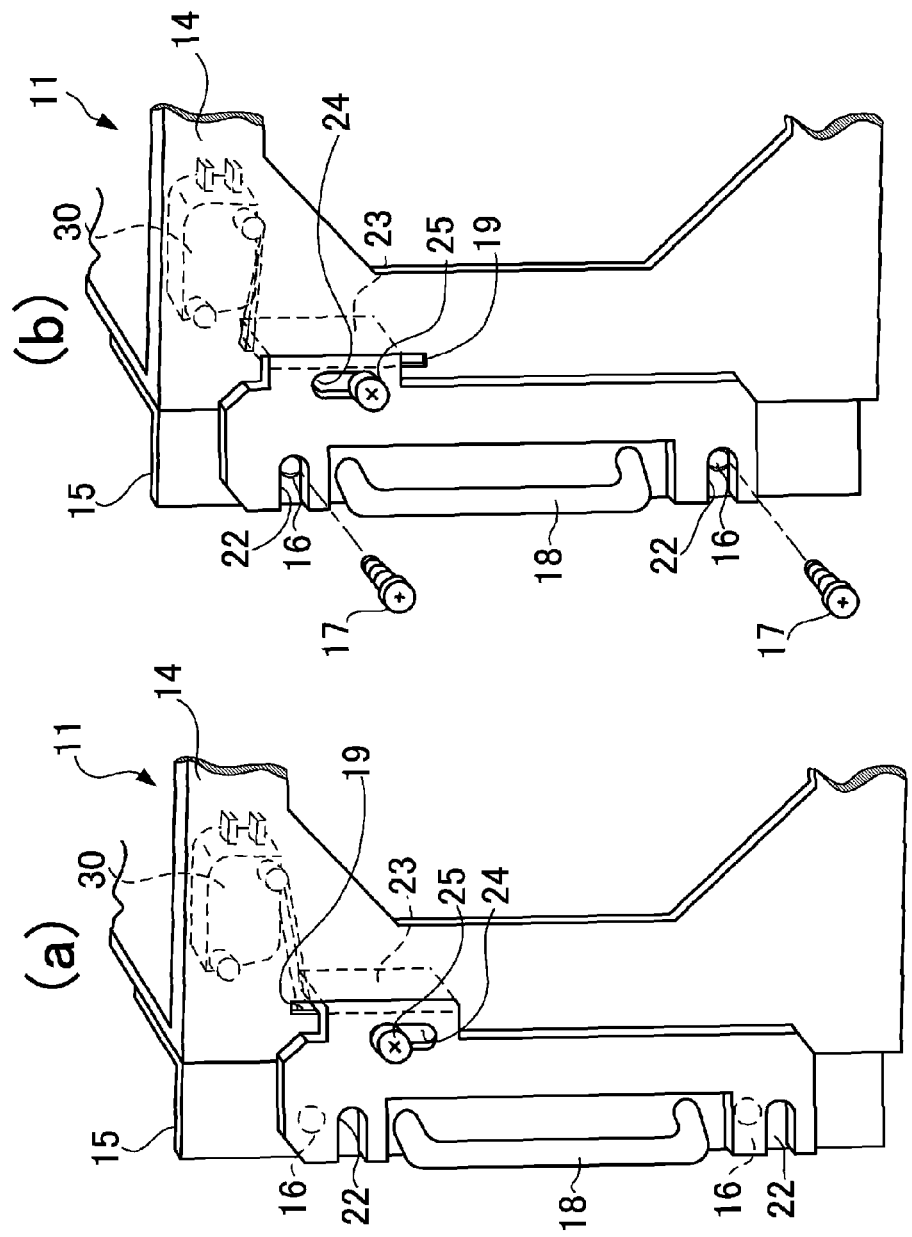
FIG. 2 is a diagram illustrating an interlocking function of the case unit illustrated in FIG. 1.

According to the interlocking mechanism of the case unit 10 in which the sliding member 21 with such a configuration is attached to the front surface of the front panel 14, the fixing screw 17 is not inserted through the screw insertion hole 16 while the case unit 10 is separated from the rack body 2. Thus, as illustrated in FIG. 2A, the sliding member 21 is placed at the down position due to the own weight. Accordingly, in this state, the screw insertion hole 16 which is provided in the case attachment member 15 is covered and hidden at one side edge portion of the sliding member 21. Further, since the bent piece 23 is placed at the down position at the same time, the interlocking switch 30 is not pressed and biased by the bent piece 23. Accordingly, the interlocking switch 30 is maintained in an off state.

When the case unit 10 is mounted on the rack body 2 in this state, the plug-in connector 13 is connected to the connection portion provided in the rear surface of the rack body 2. However, in this state, the interlocking switch 30 is maintained in an off state, and the supply of electric power to the electric apparatus body provided inside the case unit 10 is stopped. Accordingly, the electric apparatus body is not operated in this state.

When the sliding member 21 is lifted in order to fix the case unit 10 mounted on the rack body 2 to the rack body 2 in this state, the window portion 22 is placed at a position where the screw insertion hole 16 is formed as illustrated in FIG. 2B, and hence the screw insertion hole 16 is exposed. As a result, the fixing screw 17 is fitted so as to be inserted through the screw insertion hole 16 from the window portion 22, and hence the fixing screw 17 can be threaded into the screw hole of the rack body 2. Then, the fixing screw 17 is fixed to the screw hole of the rack body 2. Accordingly, the case attachment member 15 is nipped between the head portion of the fixing screw 17 and the support column of the rack body 2, and hence the case unit 10 is completely attached and fixed to the rack body 2.

At the same time, the operation piece of the interlocking switch 30 is pressed and biased by the bent piece 23 of the sliding member 21. Then, the interlocking switch 30 is turned on while the operation piece is pressed and biased, so that the supply of electric power to the electric apparatus body provided inside the case unit 10 is allowed. Subsequently, the head portion of the fixing screw 17 is fitted into the window portion 22, so that the sliding member 21 is held at the up position in a fixed state. Accordingly, the interlocking switch 30 is also maintained in an on state and the operation of the electric apparatus body is controlled in this state. In other words, the case unit 10 which makes each of the power supply units 3 (3a to 3n) may be operated.

Meanwhile, when the maintenance of each of the power supply units 3 (3a to 3n) is performed by separating the case unit 10 from the rack body 2, the fixing screw 17 is separated. Then, since the engagement between the fixing screw 17 and the window portion 22 is released when the fixing screw 17 is separated from the rack body 2, the sliding member 21 moves downward to the down position due to the own weight as illustrated in FIG. 2A. Subsequently, an operation in which the interlocking switch 30 is pressed and biased by the bent piece 23 with the downward movement of the sliding member 21 is released, and the interlocking switch 30 is set to an off state.

Accordingly, even when a step of stopping the operation of each of the power supply units 3 (3a to 3n) using the control unit 4 in advance is neglected, the operation of the case unit 10 making each of the power supply units 3 (3a to 3n) is forcedly stopped at the time point in which the fixing screw 17 is separated. Therefore, when the fixing screw 17 is separated so as to extract the case unit 10 from the rack body 2, the operation of the case unit 10, that is, the operation of each of the power supply units 3 (3a to 3n) is essentially stopped. As a result, when the connection between the plug-in connector 13 and the connector portion provided in the rear surface of the rack body 2 is released with the operation of extracting the case unit 10 from the rack body 2, a high voltage is not applied to the connector connection portion. Thus, it is possible to effectively prevent a problem of hot swapping in the related art.

In particular, the interlocking mechanism with the above-described configuration is provided in the front panel 14 of the case unit 10 so as to be movable in the vertical direction, and the sliding member 21 which displaces to the down position due to the own weight is held at the up position by using the fixing screw 17 for fixing the case unit 10 to the rack body 2. Further, the sliding member 21 is displaced to the down position due to the own weight just by separating the fixing screw 17. Then, the interlocking switch 30 is selectively turned on or off by the bent piece 23 provided in the sliding member 21 with the vertical movement of the sliding member 21.

Accordingly, since the fixing screw 17 is removed when the case unit 10 is detached from the rack body 2, the interlocking switch 30 may be reliably set to an off state with a simple and easy configuration. Therefore, the hot swapping of the connector connection portion may be prevented. Accordingly, it is possible to ensure a safety during the attachment and the detachment of the case unit 10 and to prevent an unwilling failure during the attachment and the detachment of the case unit 10. In this way, a considerably practical effect is obtained.

Further, the invention is not limited to the above-described embodiment. In the embodiment, the movement direction of the sliding member 21 is regulated by the elongated hole 24 through which the shoulder screw 25 is inserted and the slit hole 19 through which the bent piece 23 is inserted, and the posture in which the sliding member 21 is attached to the front panel 14 is regulated. However, for example, a configuration may be employed in which the elongated hole 24 used to insert the shoulder screw 25 therethrough is provided at each of a plurality of positions in parallel and the attachment posture and the movement direction of the sliding member 21 are regulated by the elongated hole 24.

Further, the shape of the window portion 22 may be formed by an annular hole having a diameter slightly larger than the diameter of the head portion of the fixing screw 17 instead of the above-described U-shaped notch. Further, a pressing member that is formed as, for example, a pressing pin used to pressing against the interlocking switch 30 instead of the bent piece 23 may be inserted through the slit hole 19 so as to be attached to the sliding member 21. Further, in the embodiment, an example has been described in which the invention is applied to the power supply units 3 (3a to 3n) making the UPS apparatus 1 as the case unit 10, but the invention may be also applied to the control unit 4.

Further, the sliding member 21 that is provided at one end side of the front surface of the case unit 10 has been described herein, but the sliding member 21 may be also provided at the other end side of the front surface of the case unit 10. In this case, the shape of the sliding member 21 provided at the other end side of the front surface of the case unit 10 may be realized as a shape which is bilaterally symmetrical to the sliding member 21 provided at one end side. Further, the sliding member 21 may be also provided at both ends of the front surface of the case unit 10. Further, there is no need to mention that the invention may be also applied to the case unit 10 making an apparatus other than the UPS apparatus 1. In addition, the invention may be modified into various forms within the scope of the spirit of the invention.

EXPLANATIONS OF LETTERS OR NUMERALS

1 UPS apparatus
2 Rack body
3 (3a to 3n) Power supply unit
4 Control unit
10 Case unit
11 Case
12 Cooling fan
13 Plug-in connector
14 Front panel
15 Case attachment member (L-shaped angle member)
16 Screw insertion hole
17 Fixing screw
19 Slit hole
21 Sliding member
22 Window portion
23 Bent piece (operation member)
24 Elongated hole
25 Shoulder screw (support member)
30 Interlocking switch (micro switch)

The invention claimed is:
1. A case unit that accommodates an electric apparatus body into a case of a predetermined size and is detachably mounted on a rack body from a front side of the rack body so as to operate the electric apparatus body, the case unit comprising:

a pair of case attachment members that are provided at both ends of a front side of the case while being projected in the horizontal direction so as to fix the case to the rack body;

a screw insertion hole that is provided at each of the case attachment members and is used to insert a fixing screw of the case into the rack body;

a sliding member that is provided in a front panel of the case so as to be movable in the vertical direction and is placed at a down position due to the weight of the sliding member;

a window portion that is provided in the sliding member and is used to cover and hide the screw insertion hole when the sliding member is located at the down position and to expose the screw insertion hole when the sliding member is lifted to an up position against gravity; and an interlocking switch that is provided in the case and is used to control the operation of the electric apparatus body in a manner such that the interlocking switch is pressed by the sliding member and turned on when the sliding member is placed to the up position, and is released from the pressure of the sliding member and turned off when the sliding member is placed at the down position.

2. The case unit according to claim 1,
wherein the sliding member includes
a main body portion that extends in the vertical direction along the front panel of the case,
an elongated hole that is formed in the main body portion by boring and is used to movably support the sliding member in the vertical direction while a support member projected in the front panel is inserted therethrough, and
an operation member that extends from the main body portion in a direction from the front surface of the front panel toward the rear surface thereof, is projected toward the rear surface of the front panel through a slit hole which is bored in the front panel and extends in the vertical direction, and presses against the interlocking switch provided at the rear surface of the front panel of the case.

3. The case unit according to claim 2,
wherein the operation member is formed as a bent piece that is formed by bending one side edge portion of the main body portion toward the front panel and is inserted through the slit hole.

4. The case unit according to claim 1,
wherein the sliding member is held at the up position by being locked to a head portion of the fixing screw of the case mounted on the rack body wherein the fixing screw is inserted from the screw insertion hole exposed through the window portion.

5. The case unit according to claim 1,
wherein the case unit is formed so that a rear surface of the case is provided with a plug-in connector that is connected to a connector portion provided in an inner portion of the rack body by being mounted on the rack body and is separated from the connector portion by being detached from the rack body.

6. The case unit according to claim 1,
wherein the rack body is used to accommodate a plurality of case units in the vertical direction in a stacked state and to operate the plurality of case units mounted on the rack body in parallel.

7. The case unit according to claim 1,
wherein the electric apparatus body is an electric power converter that supplies electric power to load equipment.

8. The case unit according to claim 1,
wherein the interlocking switch is a micro switch that interrupts the supply of electric power to the electronic apparatus body.

9. The case unit according to claim 2,
wherein the support member projected in the front panel is formed as a shoulder screw that includes a stepped portion having a length corresponding to the thickness of the sliding member between a screw portion and a head portion and supports the sliding member so as to be movable in the vertical direction by nipping the main body portion of the sliding member between the head portion and the front panel into which the screw portion is threaded.

* * * * *